US008809947B1

(12) United States Patent
Akarvardar et al.

(10) Patent No.: US 8,809,947 B1
(45) Date of Patent: Aug. 19, 2014

(54) INTEGRATED CIRCUITS AND METHODS FOR FABRICATING INTEGRATED CIRCUITS WITH CLADDED NON-PLANAR TRANSISTOR STRUCTURES

(71) Applicant: GlobalFoundries, Inc., Grand Cayman (KY)

(72) Inventors: Kerem Murat Akarvardar, Saratoga Springs, NY (US); Ajey Poovannummoottil Jacob, Albany, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 13/905,741

(22) Filed: May 30, 2013

(51) Int. Cl.
  *H01L 29/08* (2006.01)
  *H01L 29/16* (2006.01)
  *H01L 29/78* (2006.01)
  *H01L 21/20* (2006.01)

(52) U.S. Cl.
  USPC ............ 257/332; 257/E29.262; 257/E21.102; 438/198; 438/269

(58) Field of Classification Search
  None
  See application file for complete search history.

(56) References Cited

U.S. PATENT DOCUMENTS

| | | | | |
|---|---|---|---|---|
| 6,774,390 B2 * | 8/2004 | Sugiyama et al. | ............... | 257/19 |
| 7,550,332 B2 * | 6/2009 | Yang | .............................. | 438/152 |
| 8,304,817 B2 * | 11/2012 | Tezuka et al. | .................. | 257/255 |
| 2011/0163355 A1 * | 7/2011 | Tezuka et al. | .................. | 257/255 |

* cited by examiner

*Primary Examiner* — Thomas L Dickey
*Assistant Examiner* — Joseph Schoenholtz
(74) *Attorney, Agent, or Firm* — Ingrassia Fisher & Lorenz, P.C.

(57) ABSTRACT

In an exemplary embodiment, a method for fabricating integrated circuits includes providing a semiconductor substrate. The method etches the semiconductor substrate to form a non-planar transistor structure having sidewalls. On a standard (100) <110> substrate the fin sidewalls have (110) surface plane if the fins are aligned or perpendicular with the <110> wafer notch. The method includes depositing a sacrificial liner along the sidewalls of the non-planar transistor structure. Further, a confining material is deposited overlying the semiconductor substrate and adjacent the sacrificial liner. The method includes removing at least a portion of the sacrificial liner and forming a void between the sidewalls of the non-planar transistor structure and the confining material. A cladding layer is epitaxially grown in the void. Since the sidewall growth is limited by the confining material, a cladding layer of uniform thickness is enabled on fins with (110) sidewall and (100) top surface.

20 Claims, 2 Drawing Sheets

INTEGRATED CIRCUITS AND METHODS FOR FABRICATING INTEGRATED CIRCUITS WITH CLADDED NON-PLANAR TRANSISTOR STRUCTURES

TECHNICAL FIELD

The technical field generally relates to integrated circuits and methods for fabricating integrated circuits, and more particularly relates to integrated circuits and methods for fabricating integrated circuits with non-planar transistor structures and cladding layers overlying the non-planar transistor structures.

BACKGROUND

In contrast to conventional planar metal-oxide-semiconductor field-effect transistors ("MOSFETs"), multi-gate transistors incorporate two or more gates into a single device. Relative to single gate transistors, multi-gate transistors reduce off-state current leakage, increase on-state current flow, and reduce overall power consumption. Multi-gate devices having non-planar topographies also tend to be more compact than conventional planar transistors and consequently permit higher device densities to be achieved.

One known type of non-planar, multi-gate transistor, commonly referred to as a "finFET," includes two or more parallel fins ("fin structures") formed on a semiconductor substrate. The fin structures extend along a first axis between common source and drain electrodes. In conventional finFET fabrication, the crystalline semiconductor material forming the fin structures is arranged such that the sidewalls of the fin structures extending in the first axis direction are parallel to the crystalline material's (110) plane, while the upper surfaces of the fin structures are parallel to the crystalline material's (100) plane.

FinFETs further include at least one conductive gate structure that is formed over the fin structures and extends along a second axis generally perpendicular to the first axis. Source and drain regions are formed in each fin structure on opposite sides of the gate structure. The gate extends across and over the fin structures such that an intermediate region of the gate conformally overlays three surfaces of each fin structure (i.e., an upper surface, a first sidewall surface, and a second opposing sidewall surface of each fin). Because the gate structure surrounds the fin structure on three surfaces, the finFET essentially has three gates controlling the current through the fin structure or channel region. These three gates provide three channels for electrical signals to travel, thus effectively increasing the conductivity per unit surface area as compared to a conventional planar transistor.

While providing the advantages noted above, finFETs and other non-planar multi-gate devices (e.g., triFETs) can be somewhat difficult to fabricate due to their unique topographies, particularly at advanced technology nodes. One particular difficulty is obtaining high PFET mobility at a scaled gate pitch because the conventional embedded SiGe volume decreases at each technology node.

It may be possible to use an epitaxial cladding layer, such as silicon germanium (SiGe) to form the channel material to provide high PFET mobility. However, while the epitaxial deposition of cladding material is easily incorporated into the processing of planar transistor structures, such a process introduces drawbacks for non-planar transistors, as conventionally their fin sidewall surfaces are in the (110) plane. Epitaxial deposition of cladding material on surfaces in the (110) plane results in the formation of faceted cladding layers with non-uniform thicknesses across the original Si fin. Non-uniformity in the thickness of diamond-shaped cladding layers provides a detrimental impact to device performance.

Accordingly, it is desirable to provide integrated circuits and methods for fabricating integrated circuits with improved non-planar transistor structures. Also, it is desirable to provide integrated circuits and methods for fabricating integrated circuits with uniform cladding layers. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In one exemplary embodiment, a method for fabricating integrated circuits includes providing a semiconductor substrate. The method etches the semiconductor substrate to form a non-planar transistor structure having sidewalls. The method includes depositing a sacrificial liner along the sidewalls of the non-planar transistor structure. Further, a confining material is deposited overlying the semiconductor substrate and adjacent the sacrificial liner. The method includes removing at least a portion of the sacrificial liner and forming a void between the sidewalls of the non-planar transistor structure and the confining material. A cladding layer is epitaxially grown in the void.

In accordance with another embodiment, a method is provided for fabricating an integrated circuit. The method for fabricating integrated circuits includes providing a semiconductor substrate and forming a non-planar transistor structure overlying the semiconductor substrate and having sidewalls. Further, the method includes forming a cladding layer adjacent the sidewalls and confining the cladding layer to a shape having a uniform thickness.

In another embodiment, an integrated circuit is provided. The integrated circuit includes a semiconductor substrate and a non-planar transistor structure overlying the semiconductor substrate. The non-planar transistor structure is formed from crystalline semiconductor material and includes sidewalls parallel with the (110) plane. The integrated circuit further includes side channel regions formed by epitaxial cladding material having a substantially uniform thickness adjacent the sidewalls of the non-planar transistor structure.

BRIEF DESCRIPTION OF THE DRAWINGS

Embodiments of integrated circuits and methods for fabricating integrated circuits with cladded non-planar transistor structures will be described in conjunction with the following drawing figures, wherein like numerals denote like elements, and wherein.

DETAILED DESCRIPTION

The following detailed description is merely exemplary in nature and is not intended to limit the various embodiments of the integrated circuits or the methods for fabricating integrated circuits claimed herein. Furthermore, there is no intention to be bound by any expressed or implied theory presented in the preceding technical field, background or brief summary, or in the following detailed description.

Integrated circuits and methods for fabricating integrated circuits with cladded non-planar transistor structures as described herein avoid issues faced when applying conventional planar structure processes to non-planar structures. For example, the integrated circuits and methods for fabricating integrated circuits described herein avoid the formation of faceted and non-uniform cladding layers overlying non-planar transistor structures. Specifically, for conventionally oriented semiconductor substrates, it has been observed that the epitaxial deposition of cladding material, such as silicon germanium, on the sidewalls of non-planar structures leads to the formation of "diamond-shaped" layers having variable thicknesses. Conventionally, semiconductor substrates or wafers having a (100) top plane are formed with a notch at the edge of the wafer for alignment with processing machines. During processing, non-planar transistor structures are formed on top of the wafer in alignment with or perpendicular to the notch. Thus, conventionally formed non-planar transistor structures are provided with sidewalls in the (110) plane and top surfaces in the (100) plane.

Epitaxial deposition of cladding material forms "diamond-shaped" layers having variable thicknesses due to difference in growth rates for different semiconductor planes reached during the growth of an epitaxial layer on non-planar semiconductor structures. For silicon fins with a (110) sidewall, (111) planes limit the epitaxial growth and result in faceting. The thickness non-uniformity cannot be overcome by realigning the non-planar transistor structures to a different plane without performance drawbacks because carrier mobility is optimized when non-planar transistor structures are formed with sidewalls in the (110) plane. To avoid non-uniformity of epitaxial cladding layers, it is contemplated herein that the cladding material be confined to a shape having a uniform thickness during the epitaxial deposition process.

FIGS. 1-7 illustrate integrated circuits and methods for fabricating the integrated circuits in accordance with an exemplary embodiment. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
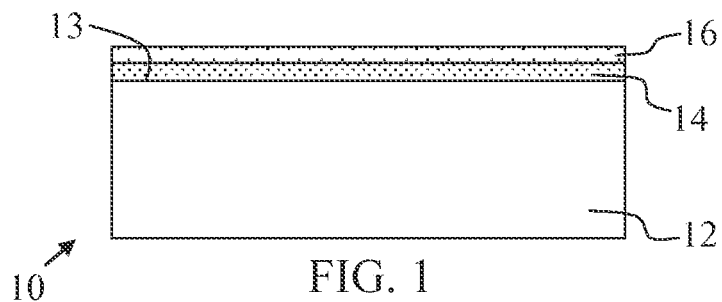
FIGS. 1-7 are cross-sectional views of a portion of an integrated circuit with cladded non-planar transistor structures, and method steps for fabricating an integrated circuit with cladded non-planar transistor structures in accordance with various embodiments herein.

In the exemplary embodiment of FIG. 1, a method for fabricating an integrated circuit 10 includes providing a semiconductor substrate 12 having a conventional upper (100) plane 13. The semiconductor substrate 12 is preferably formed from semiconductor material such as silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. The semiconductor substrate 12 may be realized as a bulk silicon or silicon-on-insulator (SOI) wafer.

In the exemplary process of FIG. 1, an upper cladding layer 14 is formed overlying the semiconductor substrate 12. As used herein, an "overlying" layer may lie directly on or indirectly over an underlying layer, as long as the underlying layer has a semiconductor crystal lattice. In an exemplary embodiment, the upper cladding layer 14 is formed on the semiconductor substrate 12. An exemplary upper cladding layer 14 may be epitaxially deposited to a thickness of about 3 nanometers (nm) to about 5 nm. While any suitable cladding material may be used to form the upper cladding layer 14, in an exemplary embodiment, the cladding material is silicon germanium (SiGe). Further, deposition and use of the upper cladding layer 14 is optional. Specifically, in conjunction with the formation of a cladding layer on the sidewalls of a fin structure, the deposition of upper cladding layer 14 provides for a cladding structure on all three surfaces of a fin structure, i.e., upper cladding layer 14 provides the cladding structure on the top surface of the fin structure. However, in certain embodiments the cladding structure may only include cladding layers on the sidewalls of the fin structure. Therefore, upper cladding lay 14 may be absent in those embodiments.

FIG. 1 also depicts the optional formation of a masking layer 16 overlying the upper cladding layer 14. While FIGS. 1-6 illustrate an embodiment using the masking layer 16, other embodiments may not include it as described below in reference to FIG. 5. Further, the masking layer 16 can be selected from any material appropriate for masking purposes as disclosed below in relation to FIG. 5; however, an exemplary material for forming masking layer 16 is silicon oxide. An exemplary process for depositing a silicon oxide masking layer 16 is plasma-enhanced chemical vapor deposition (PECVD). In an exemplary embodiment, the masking layer 16 is formed with a thickness of about 10 nm.

Figure 2:
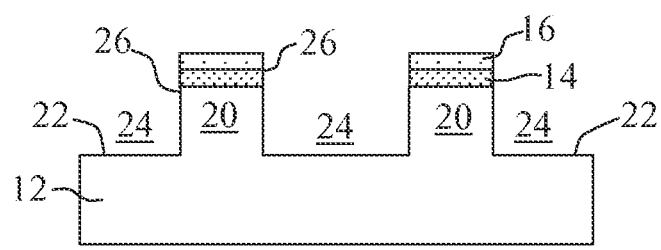

In FIG. 2, non-planar transistor structures 20, such as fin structures, are formed overlying the semiconductor substrate 12. In the exemplary embodiment of FIG. 2, the non-planar transistor structures 20 are formed from the semiconductor material of the semiconductor substrate 12. Specifically, an etching process recesses portions of the semiconductor substrate 12 (and removes the overlying portions of the upper cladding layer 14 and masking layer 16) to form a recessed surface 22 in the semiconductor substrate 12 and trenches 24. As a result, each non-planar transistor structure 20 is formed with opposite sidewalls 26 with (110) surface orientation since fins 20 are aligned with the <110> notch of the substrate 12. While any suitable process may be used to form the non-planar transistor structures 20, an exemplary embodiment uses a sidewall image transfer (SIT) process. Such a process is well-known and is not described further here.

Figure 3:
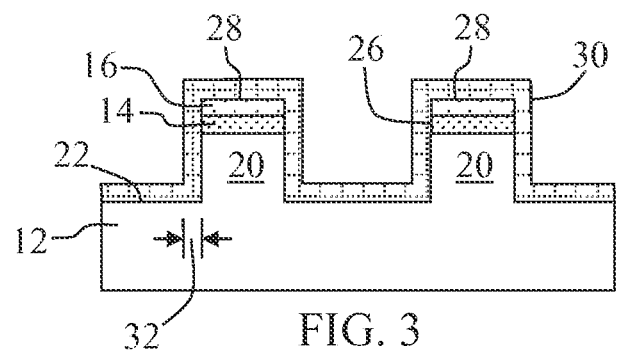

Referring to FIG. 3, a sacrificial liner 30 is deposited overlying the non-planar transistor structures 20 and the recessed surface 22 of the semiconductor substrate 12. As shown, the exemplary sacrificial liner 30 is conformally deposited, such as by chemical vapor deposition, and forms along the sidewalls 26 as well as the exposed top surfaces 28 (of the masking layer 16 if used, or of the upper cladding layer 14 if used, or of the non-planar transistor structures 20). In an exemplary embodiment, the sacrificial liner 30 is formed from silicon nitride, though other suitable materials may be used. The exemplary sacrificial liner 30 is formed with a uniform thickness, indicated by arrows 32, equal to the thickness of the upper cladding layer 14, such as about 3 nm to about 5 nm. An exemplary conformal deposition process is chemical vapor deposition (CVD).

Figure 4:
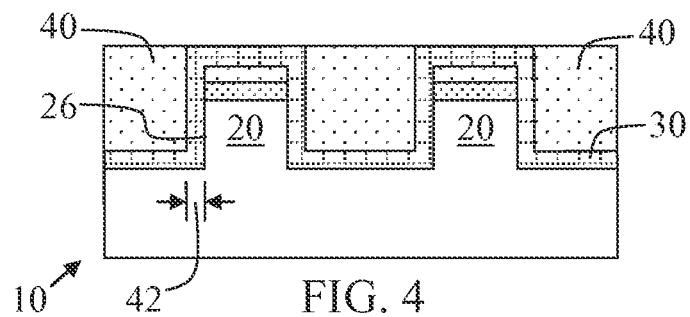

After formation of the sacrificial liner 30, a confining material 40 is deposited over the partially completed integrated circuit 10 in FIG. 4. An exemplary confining material 40 is chosen such that the sacrificial liner 30 may be selectively etched during the processing described in FIG. 5, while the confining material 40 is not etched. Therefore, the selection of the confining material 40 may be dependent on the material forming the sacrificial liner 30 and on the selected process for etching the sacrificial liner 30. In an exemplary embodiment including a silicon nitride sacrificial liner 30, the confining material 40 may be silicon oxide and may be deposited by chemical vapor deposition.

The confining material 40 may be deposited to fill the trenches 24 (shown in FIG. 2) between the non-planar transistor structures 20 and to form an overburden above the portion of the sacrificial liner 30 overlying the non-planar transistor structures 20. In FIG. 4, any portion of the confining material 40 above the sacrificial liner 30 is removed, such as by a chemical mechanical planarization or polishing (CMP) process. The confining material 40 is formed at a uniform distance, indicated by arrows 42, from the sidewalls 26 of each non-planar transistor structure 20, as the distance 42 is equal to the thickness 32 (shown in FIG. 3) of the sacrificial liner 30.

Figure 5:
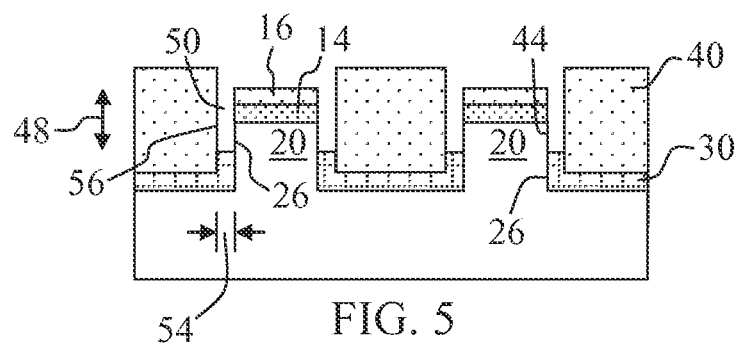

In FIG. 5, an etching process is performed to expose a portion 44 of the non-planar transistor structures 20 along each sidewall 26. Specifically, a portion of the sacrificial liner 30 adjacent the sidewalls 26 is removed. In the embodiment of FIG. 5, all of the sacrificial liner 30 adjacent the sidewalls 26 is removed to a selected depth indicated by double-headed arrow 48. An exemplary etching process is a wet etch performed with a hot phosphoric acid solution. Such an etchant may be used when the sacrificial liner 30 is silicon nitride and the masking layer 16 is silicon oxide, as it is selective toward the removal of silicon nitride. Other embodiments may use an etchant that does not attack the upper cladding layer 14. In such an embodiment, the masking layer 16 may be eliminated from the process. The etching process may use other wet etchants or dry etch processes to remove a portion of the sacrificial liner 30.

As shown in FIG. 5, the removal of the portion of the sacrificial liner 30 results in formation of a void 50 adjacent the exposed portion 44 of the non-planar transistor structures 20 along each sidewall 26. The voids 50 are also adjacent the upper cladding material 14 and the masking layer 16, if used, along the sidewall 26. Each void 50 has a width, indicated by arrows 54, that is equal to the distance 42 (shown in FIG. 4) between the confining material 40 and the sidewalls 26 and equal to the thickness 32 (shown in FIG. 3) of the sacrificial liner 30. Further, in the exemplary embodiment of FIG. 5, each void 50 may be considered to have a substantially rectangular shape as each void 50 is bounded by a sidewall 26 and by a surface 56 of confining material 40 that is parallel to the sidewall 26.

Figure 6:
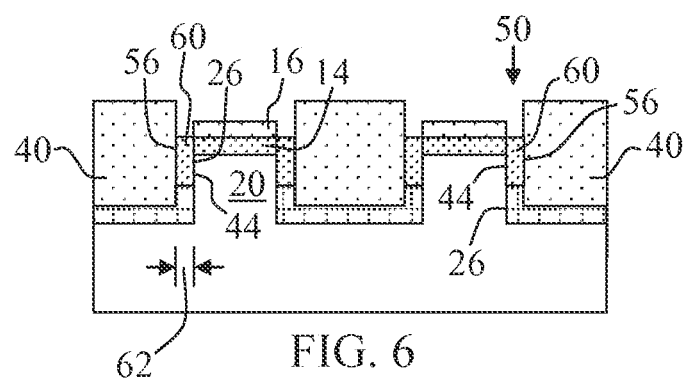

In FIG. 6, a side cladding layer 60 is formed in each void 50 on the exposed portion 44 of the non-planar transistor structures 20 along each sidewall 26. In an exemplary embodiment, the material forming the side cladding layer 60 is the same as the material forming the upper cladding layer 14. For example, both layers 14 and 60 may be SiGe.

An exemplary process for forming the side cladding layers 60 is epitaxial growth on the exposed portions 44 of the sidewalls 26. As the side cladding layers 60 grow, a tendency for the epitaxial material to form a diamond shape is inhibited by the shape of the voids 50. Specifically, the epitaxial material grows laterally outward from the exposed portions 44 of the sidewalls 26 until it contacts the surface 56 of the confining material 40. Then, it cannot grow laterally any farther. As a result, each side cladding layer 60 is confined by the confining material 40 to a uniform thickness, indicated by arrows 62, equal to: the thickness 32 (shown in FIG. 3) of the sacrificial liner 30, the distance 42 (shown in FIG. 4) between the sidewalls 26 and the confining material 40, and the width 54 (shown in FIG. 5) of the voids 50. The epitaxial deposition process may be timed so that the side cladding layer 60 meets and merges with the upper cladding layer 14 in a uniform manner, and so that the side cladding layer 60 does not grow higher than the upper cladding layer 14.

Figure 7:
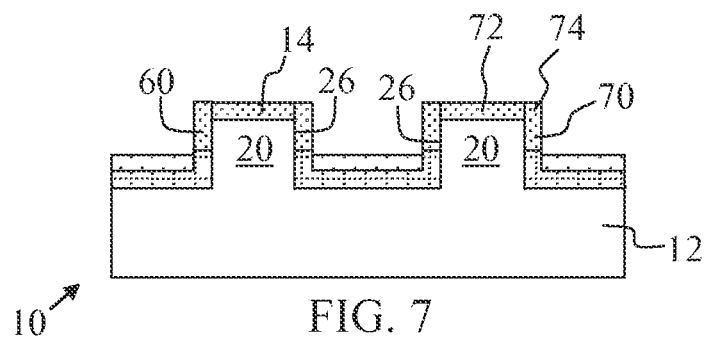

In FIG. 7, in an exemplary embodiment the masking layer 16 (if used) and at least a portion of the confining material 40 is removed. The removal process may be performed with an etchant that is selective to the masking layer 16 (if used) and confining material 40. To simplify the etching process, an exemplary embodiment uses the same material for both the masking layer 16 and the confining material 40, such as silicon oxide. For such an embodiment using silicon nitride for the sacrificial liner 30, the etchant used in FIG. 7 may be a hydrofluoric acid solution. A dry etch process selective to the masking layer 16 (if used) and confining material 40 also may be used. After formation of the partially completed integrated circuit 10 of FIG. 7, further typical processing may be performed, such as the conventional processing for gate formation, contact formation and connection to an interconnect structure.

As set forth above and shown in FIG. 7, a portion of an integrated circuit 10 is provided. The portion of the integrated circuit 10 includes a semiconductor substrate 12 and non-planar transistor structures 20 overlying the semiconductor substrate 12. The non-planar transistor structures 20 are formed from crystalline semiconductor material having a (100) upper plane and sidewalls in a (110) plane. As shown, side channel regions 70 are formed by epitaxial side cladding layers 60 adjacent the sidewalls 26 of the non-planar transistor structures 20. Further, each epitaxial side cladding layer 60 has a substantially uniform thickness 62 (shown in FIG. 6). Upper channel regions 72 are formed by epitaxial upper cladding layers 14 adjacent the upper surfaces of the non-planar transistor structures 20. The cladding layers 14 and 60 form a channel region structure 74 and provide the channel material for the non-planar transistor structures 20.

The integrated circuits and methods for fabricating integrated circuits described herein provide non-planar transistor structures including uniform cladding layers. As described above, the epitaxial cladding material is confined by the confining material to a uniform thickness during formation. The confining material is in turn uniformly distanced from the sidewalls of the non-planar transistor structures during formation by the conformal sacrificial layer. With uniformly thick cladding material serving as the channel material for non-planar transistor structures herein, the non-planar transistor structures exhibit a uniform threshold voltage, high carrier mobility and predictable and improved transistor device performance.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   providing a semiconductor substrate;
   etching the semiconductor substrate to form a non-planar transistor structure having sidewalls;

depositing a sacrificial liner along the sidewalls of the non-planar transistor structure;

depositing a confining material overlying the semiconductor substrate and adjacent the sacrificial liner;

removing at least a portion of the sacrificial liner and forming a void between the sidewalls of the non-planar transistor structure and the confining material; and epitaxially growing a cladding layer in the void.

2. The method of claim 1 wherein:

providing a semiconductor substrate comprises providing a crystalline semiconductor substrate having a (100) plane and <110> notch; and etching the semiconductor substrate comprises etching the semiconductor substrate to form the non-planar transistor structure having sidewalls parallel with a (110) plane.

3. The method of claim 1 wherein:

removing at least a portion of the sacrificial liner and forming a void between the sidewalls of the non-planar transistor structure and the confining material comprises forming a void having a substantially uniform width, and epitaxially growing a cladding layer in the void comprises epitaxially growing a cladding layer having a substantially uniform thickness.

4. The method of claim 1 wherein epitaxially growing a cladding layer in the void comprises epitaxially growing a cladding layer bound by the sidewalls and the confining material.

5. The method of claim 1 wherein epitaxially depositing a cladding layer in the void comprises epitaxially depositing silicon germanium (SiGe) in the void.

6. The method of claim 1 further comprising depositing an upper cladding layer overlying the semiconductor substrate before etching the semiconductor substrate to form a non-planar transistor structure having sidewalls.

7. The method of claim 1 further comprising depositing an upper cladding layer overlying the semiconductor substrate before etching the semiconductor substrate to form a non-planar transistor structure having sidewalls, wherein:

depositing a sacrificial liner comprises depositing a sacrificial liner along sidewalls of the upper cladding layer;

removing at least a portion of the sacrificial liner comprises forming a void between the sidewalls of the non-planar transistor structure and of the upper cladding layer and the confining material; and epitaxially depositing a cladding layer in the void comprises epitaxially depositing a cladding layer bound by the sidewalls of the non-planar transistor structure and of the upper cladding layer and the confining material.

8. The method of claim 1 further comprising:

depositing an upper cladding layer overlying the semiconductor substrate before etching the semiconductor substrate to form a non-planar transistor structure having sidewalls, wherein depositing a sacrificial liner comprises depositing a sacrificial liner overlying the upper cladding layer; and planarizing the confining material to remove the confining material from above the sacrificial liner overlying the upper cladding layer, wherein removing at least a portion of the sacrificial liner comprises removing the sacrificial liner overlying the upper cladding layer.

9. A method for fabricating an integrated circuit comprising:

providing a semiconductor substrate;

forming a non-planar transistor structure overlying the semiconductor substrate and having sidewalls;

forming a cladding layer adjacent the sidewalls while confining the cladding layer to a shape having a uniform thickness.

10. The method of claim 9 wherein forming a cladding layer adjacent the sidewalls and confining the cladding layer to a shape having a uniform thickness comprises:

forming a void adjacent the sidewalls having a uniform width substantially equal to the uniform thickness; and filling the void with the cladding layer.

11. The method of claim 9 wherein forming a cladding layer adjacent the sidewalls and confining the cladding layer to a shape having a uniform thickness comprises:

depositing a confining material overlying the semiconductor substrate and distanced from the sidewalls by a uniform distance substantially equal to the uniform thickness; and depositing the cladding layer between the sidewalls and the confining material.

12. The method of claim 9 wherein forming a cladding layer adjacent the sidewalls and confining the cladding layer to a shape having a uniform thickness comprises:

depositing a confining material overlying the semiconductor substrate;

forming a void between the sidewalls and the confining material, wherein the void has a uniform width substantially equal to the uniform thickness; and filling the void with the cladding layer.

13. The method of claim 9 wherein forming a cladding layer adjacent the sidewalls and confining the cladding layer to a shape having a uniform thickness comprises:

depositing a sacrificial liner along the sidewalls of the non-planar transistor structure; and removing at least a portion of the sacrificial liner and forming a void adjacent the sidewalls of the non-planar transistor structure, wherein the void has a uniform width substantially equal to the uniform thickness; and filling the void with the cladding layer.

14. The method of claim 9 wherein forming a cladding layer adjacent the sidewalls and confining the cladding layer to a shape having a uniform thickness comprises:

depositing a sacrificial liner along the sidewalls of the non-planar transistor structure and having a uniform liner thickness equal to the uniform thickness; and removing all of the sacrificial liner to a selected depth and forming a void adjacent the sidewalls of the non-planar transistor structure; and filling the void with the cladding layer.

15. The method of claim 9 wherein forming a non-planar transistor structure overlying the semiconductor substrate comprises forming a non-planar transistor structure on crystalline semiconductor substrate having a (100) plane with a <110> notch, wherein the sidewalls are parallel with a (110) plane.

16. The method of claim 9 wherein forming a cladding layer adjacent the sidewalls comprises epitaxially depositing a cladding layer on the sidewalls.

17. The method of claim 9 wherein forming a cladding layer adjacent the sidewalls comprises epitaxially depositing a strained semiconductor material on the sidewalls.

18. The method of claim 9 further comprising depositing an upper cladding layer overlying the semiconductor substrate before forming the non-planar transistor structure, wherein:

forming a non-planar transistor structure overlying the semiconductor substrate comprises forming sidewalls to the upper cladding layer; and forming a cladding layer comprises forming a cladding layer adjacent the sidewalls of the non-planar transistor structure and of the upper cladding layer.

19. An integrated circuit comprising:
a semiconductor substrate formed from crystalline semiconductor material and including a fin structure defined between trenches formed in the semiconductor substrate, wherein the fin structure includes sidewalls parallel with a (110) plane; and
side channel regions formed by epitaxial cladding material having a substantially uniform thickness adjacent the sidewalls of the fin structure.

20. The integrated circuit of claim 19 wherein each sidewall has a lower region and an upper region, wherein the side channel regions formed by epitaxial cladding material are in direct contact with the upper regions of the sidewalls of the fin structure, and wherein the integrated circuit further comprises a dielectric liner in direct contact with the lower regions of the sidewalls of the fin structure.

* * * * *